US008952743B2

(12) United States Patent
He

(10) Patent No.: US 8,952,743 B2
(45) Date of Patent: Feb. 10, 2015

(54) DRIVING MODULE FOR DIGITAL VISUAL INTERFACE

(75) Inventor: Feng-Long He, Shenzhen (CN)

(73) Assignee: ScienBiziP Consulting (Shenzhen) Co., Ltd., Guangdong (CN)

( * ) Notice: Subject to any disclaimer, the term of this patent is extended or adjusted under 35 U.S.C. 154(b) by 883 days.

(21) Appl. No.: 13/086,214

(22) Filed: Apr. 13, 2011

(65) Prior Publication Data

US 2012/0162174 A1 Jun. 28, 2012

(30) Foreign Application Priority Data

Dec. 22, 2010 (CN) .......................... 2010 1 0600667

(51) Int. Cl.
*H03K 17/687* (2006.01)
*G09G 5/00* (2006.01)

(52) U.S. Cl.
CPC .......... *G09G 5/006* (2013.01); *G09G 2330/026* (2013.01); *G09G 2370/12* (2013.01)
USPC ............................ 327/434; 348/836; 327/432

(58) Field of Classification Search
USPC .................................................. 327/365–508
See application file for complete search history.

(56) References Cited

U.S. PATENT DOCUMENTS

| | | | | |
|---|---|---|---|---|
| 4,808,853 A * | 2/1989 | Taylor | 326/57 |
| 8,115,535 B2 * | 2/2012 | Tzeng et al. | 327/534 |
| 2006/0087597 A1 * | 4/2006 | Testin | 348/836 |
| 2006/0266999 A1 * | 11/2006 | Snider et al. | 257/23 |
| 2009/0051506 A1 * | 2/2009 | Hicksted et al. | 340/332 |
| 2011/0074470 A1 * | 3/2011 | Sanborn et al. | 327/143 |
| 2012/0025800 A1 * | 2/2012 | Dettloff et al. | 323/299 |
| 2012/0162122 A1 * | 6/2012 | Geaghan | 345/174 |

* cited by examiner

*Primary Examiner* — Brandon S Cole
(74) *Attorney, Agent, or Firm* — Novak Druce Connolly Bove + Quigg LLP

(57) ABSTRACT

A driving module for driving a Digital Visual Interface includes an integrated chip, a pull-up resistor unit, and a voltage converter. The pull-up resistor unit includes a plurality of resistors. The voltage converter includes an array of resistors comprising a plurality of resistors and a MOSFET. Each resistor of the array of resistors includes a first end and a second end. The first ends are electrically connected to outputs of the integrated chip, and the second ends are electrically connected to a drain of the MOSFET. A source of the MOSFET is connected to ground, and a gate of the MOSFET is electrically connected to an output of the main board.

3 Claims, 2 Drawing Sheets

DRIVING MODULE FOR DIGITAL VISUAL INTERFACE

BACKGROUND

1. Technical Field

The present disclosure relates to driving modules and, more particularly to a driving module for a Digital Visual Interface (DVI).

2. Description of Related Art

An electronic device, such as a notebook, generally includes a hardware driver electrically connected to an output of the mainframe for driving the DVI. However, the working voltage of the DVI is 3 volts, but the pull-up resistor of the DVI usually pulls the voltage output from the chip of the hardware driver from zero to 3.3 volts; so it needs an added voltage converter circuit for adjusting the voltage to the DVI.

Therefore, what is needed is a driving module to overcome the above described shortcomings.

DETAILED DESCRIPTION

Figure 1:
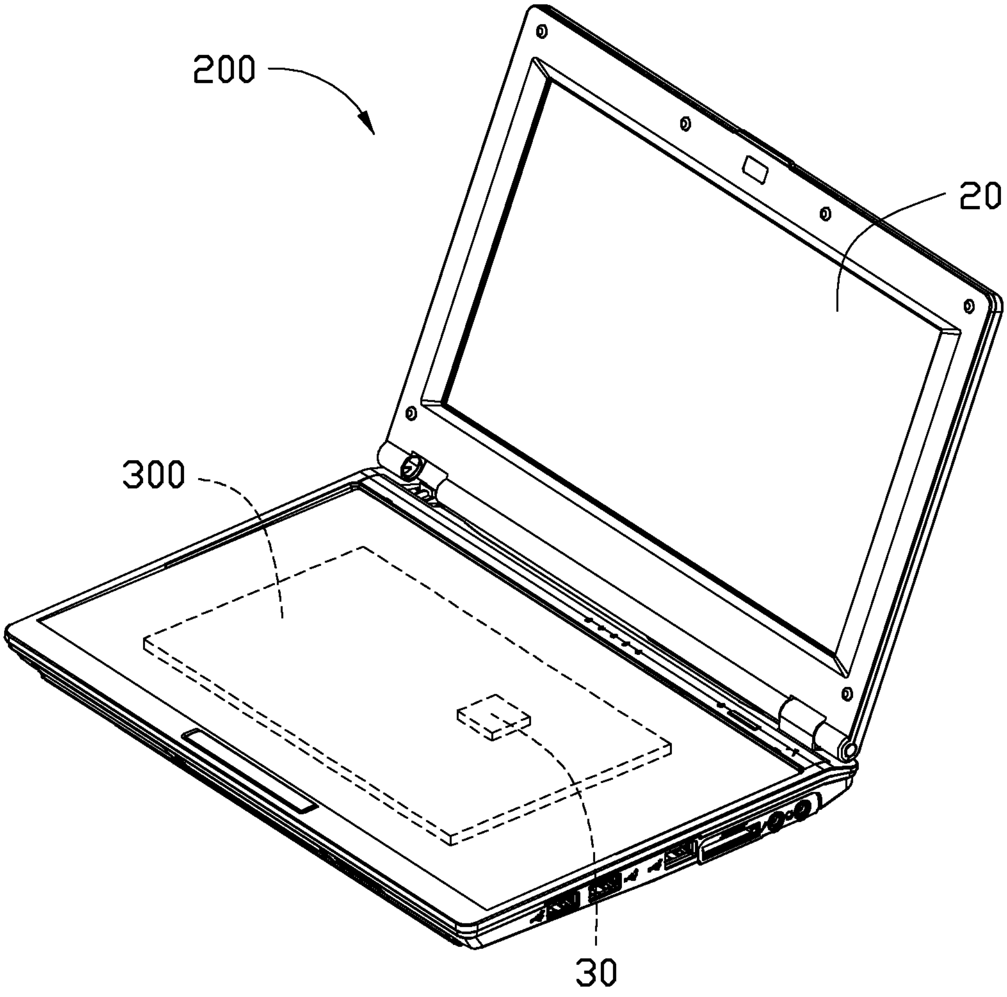
FIG. 1 is an assembled, isometric view of a notebook, in accordance with an exemplary embodiment of the present disclosure.
Figure 2:
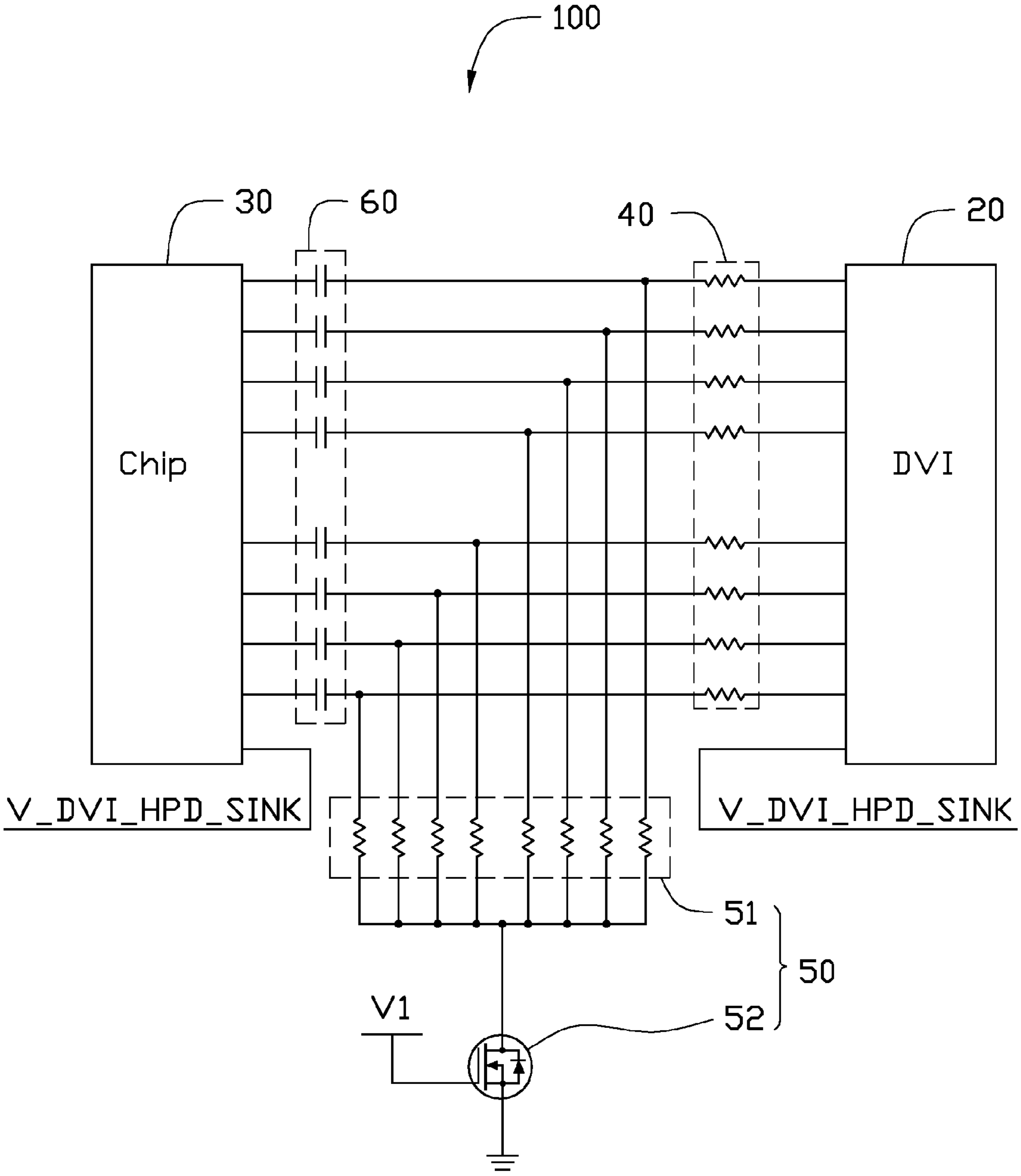
FIG. 2 is a circuit diagram of a driving module of FIG. 1.

Referring to FIGS. 1 to 2, an exemplary embodiment of a driving module 100 is shown. In the present embodiment, the driving module 100 is used for driving a DVI 20 of a notebook 200. The notebook 200 also includes a main board 300.

The driving module 100 includes an integrated chip 30, a pull-up resistor unit 40 electrically connected to an output of the chip 30, and a voltage converter unit 50.

In the present embodiment, the integrated chip 30 is driven by the main board 300 of the notebook 200. The chip 30 includes two groups of outputs for outputting driving signals. Each group includes three digital pins and a clock pin. A plurality of filter capacitors 60 (eight in this embodiment) each have a first end electrically connected to one corresponding output of the integrated chip 30. The filter capacitors 60 are configured for filtering direct signals output from the integrated chip 30; therefore, the integrated chip 30 only outputs alternating signals.

The pull-up resistor unit 40 includes eight resistors. Each resistor of the pull-up resistor unit 40 is electrically connected between a second end of one corresponding filter capacitor 60 and an input of the DVI 20.

The voltage converter unit 50 includes an array of resistors 51 and a MOSFET 52. In the present embodiment, the MOSFET 52 is an N-type depletion mode MOSFET. The array of resistors 51 includes eight resistors. One end of each of the eight resistors of the array of resistors 51 is electrically connected to the second end of one corresponding filter capacitors 60. The other ends of the eight resistors of the array of resistors 51 are all electrically connected to the drain of the MOSFET 52. The source of the MOSFET 52 is connected to ground. The gate of the MOSFET 52 is electrically connected to a voltage V1 output from the main board 300, which is about 3.3 volts.

At the initial of start up of the notebook 200, by supplying external power thereto, there is no voltage output from the main board 300 instantly. Therefore, the MOSFET 52 turns off because of the voltage V1 is zero, and it can prevent the array of resistors 51 from connecting to ground directly and damaging or destroying the DVI 20 at that moment. After driving the main board 300, the MOSFET 52 is in on-state. The pull-up resistor unit 40 pulls the voltage output from the integrated chip 30 to 3.3 volts, and the array of resistors 51 of the voltage converter unit 50 adjusts the voltage to 3 volts as the working voltage of the DVI 20.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A driving module for driving a Digital Visual Interface (DVI) of a computer comprising a main board, the driving module comprising:

an integrated chip with a plurality of outputs;

a pull-up resistor unit comprising a plurality of resistors, one end of each resistor of the pull-up resistor unit being electrically connected to one of the plurality of outputs of the integrated chip, and the other end of each resistor of the pull-up resistor unit being electrically connected to one input of the DVI; and a voltage converter comprising an array of resistors comprising a plurality of resistors and a MOSFET, each resistor of the array of resistors comprising a first end and a second end, the first ends being electrically connected to outputs of the integrated chip, and the second ends being electrically connected to a drain of the MOSFET, a source of the MOSFET being connected to ground, and a gate of the MOSFET being electrically connected to an output of the main board;

wherein the integrated chip comprises two groups of outputs for outputting driving signals, each group of outputs comprising three digital pins and a clock pin.

2. The driving module of claim 1, wherein the array of resistors comprises eight resistors, each first end being electrically connected to one output of the integrated chip.

3. The driving module of claim 2, wherein the pull-up resistor unit comprises eight resistors.

* * * * *